(12) United States Patent
Naka et al.

(10) Patent No.: US 8,184,023 B2
(45) Date of Patent: May 22, 2012

(54) ROTARY OPERATION TYPE INPUT DEVICE

(75) Inventors: Yoshio Naka, Okayama (JP); Tamotsu Yamamoto, Hyogo (JP); Takumi Nishimoto, Okayama (JP)

(73) Assignee: Panasonic Corporation, Osaka (JP)

( * ) Notice: Subject to any disclaimer, the term of this patent is extended or adjusted under 35 U.S.C. 154(b) by 867 days.

(21) Appl. No.: 12/203,239

(22) Filed: Sep. 3, 2008

(65) Prior Publication Data

US 2009/0079595 A1    Mar. 26, 2009

(30) Foreign Application Priority Data

Sep. 21, 2007  (JP) ................................. 2007-244831

(51) Int. Cl.
*H03K 17/94* (2006.01)
*H03M 11/00* (2006.01)

(52) U.S. Cl. .......................................... 341/35; 341/20

(58) Field of Classification Search ...................... 341/35
See application file for complete search history.

(56) References Cited

U.S. PATENT DOCUMENTS

2003/0224737 A1   12/2003  Yokoji et al.

FOREIGN PATENT DOCUMENTS

| EP | 1 394 666 | 3/2004 |
|---|---|---|
| JP | 03-244012 | 10/1991 |
| JP | 2003-281972 | 10/2003 |
| JP | 2004-220369 | 8/2004 |
| WO | 03/090008 | 10/2003 |

*Primary Examiner* — Jared Fureman
*Assistant Examiner* — Lucy Thomas
(74) *Attorney, Agent, or Firm* — Wenderoth, Lind & Ponack, L.L.P.

(57) ABSTRACT

A rotary input device includes a circular ring shaped operation body, a magnetic first guide plate fixed to the bottom of the operation body, movable magnets disposed on the bottom of a first flat plane of the first guide plate concentrically with the operation body, a base for rotatably supporting the operation body from beneath, a detection element for detecting a change in magnetic field from the movable contacts due to rotating operation of the operation body without making contact, and a magnetic second guide plate fixed to the base having a plurality of second flat planes opposite to the position of the movable magnets so as to be opposite to each one of the movable magnets. The movable magnets face to or depart from each one of the second flat planes of the second guide plate depending on the rotation of the operation body.

11 Claims, 7 Drawing Sheets

ROTARY OPERATION TYPE INPUT DEVICE

BACKGROUND OF THE INVENTION

1. Field of the Invention

The present invention relates to a rotary operation type input device to be mounted on various electronic appliances and having an input operation unit for searching or entering various electronic data.

2. Background Art

Recently, a rotary operation type input device for selecting and establishing various items displayed on a screen of an electronic appliance is demanded to be smaller in thickness and lower in cost in the recent trend of electronic appliances of smaller size and higher density.

Figure 7:
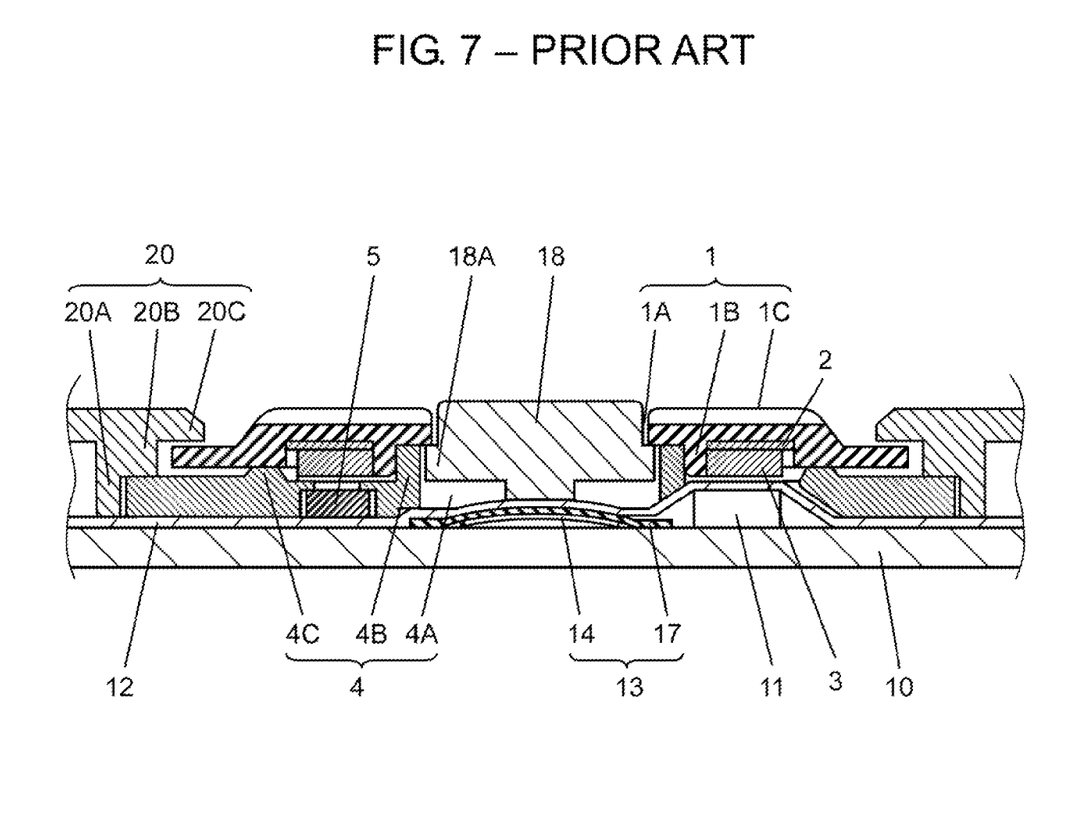
FIG. 7 is a sectional view of a conventional rotary operation type input device.
Figure 8:
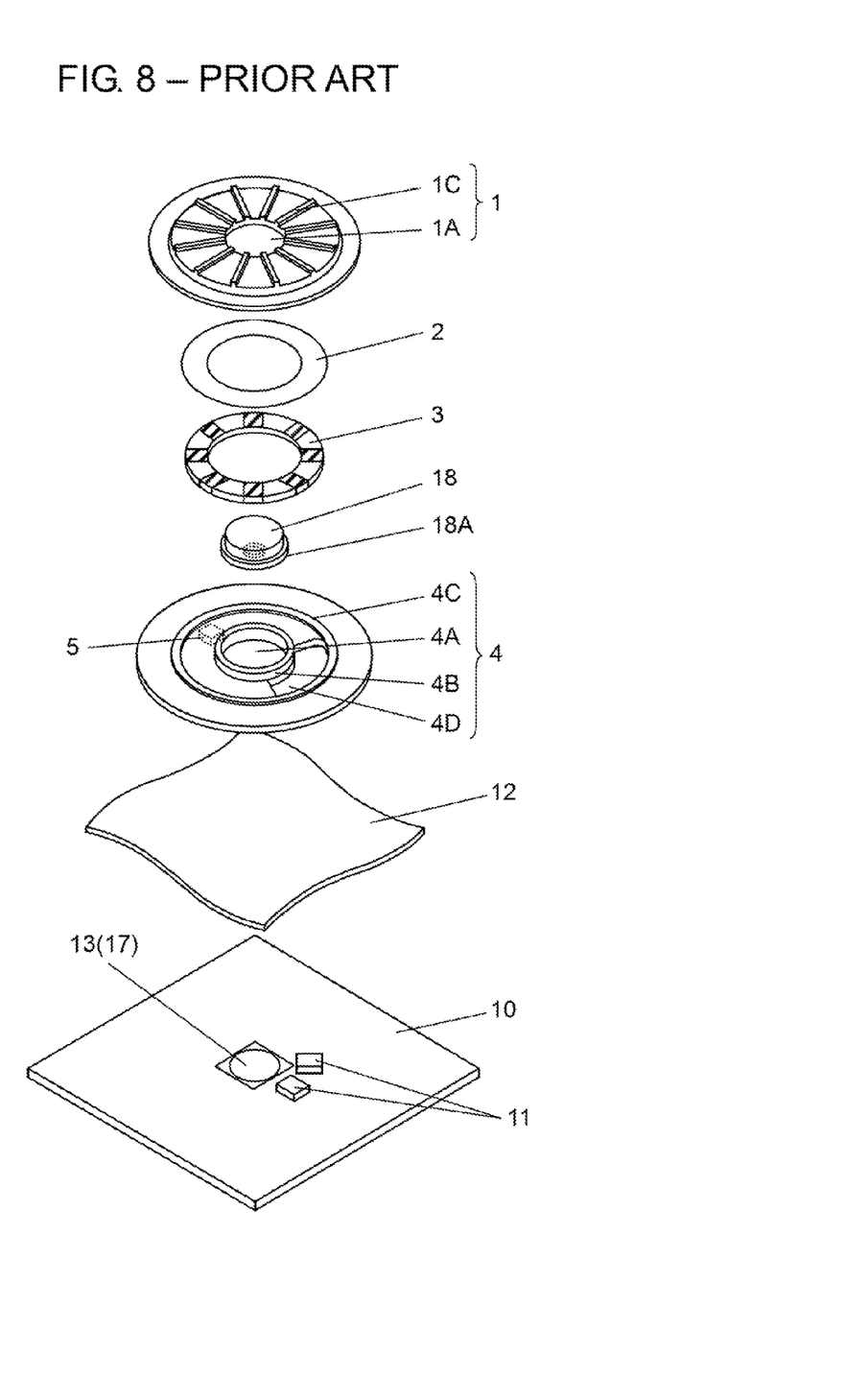
FIG. 8 is its perspective exploded view.

A conventional rotary operation type input device disclosed in Unexamined Japanese Patent Application Publication No. 2003-281972 is explained by referring to FIG. 7 and FIG. 8.

FIG. 7 is a sectional view of a conventional rotary operation type input device, and FIG. 8 is its perspective exploded view. In these drawings, a conventional rotary operation type input device has operation body 1 made of resin formed in a disk of circular ring shape having circular central hole 1A. Magnetic plate 2 of silicon steel plate or magnetic stainless steel processed and formed in a circular ring shape is fixed below operation body 1. Ring magnet 3 of circular shape is fixed beneath magnetic plate 2. That is, operation body 1, magnetic plate 2, and ring magnet 3 are overlaid and fixed concentrically.

Ring magnet 3 is magnetized alternately in N poles and S poles at specified angles in the circumferential direction. That is, in ring magnet 3 shown in FIG. 8, the hatching positions are N poles magnetized in a specified angle range, and the other positions are S poles magnetized in the same angle range.

In the conventional rotary operation type input device, the lower part of operation body 1 is provided with base 4 made of resin formed in a circular ring shape having circular through-hole 4A in the center, concentrically with operation body 1. Base 4 is formed with inner tube 4B protruding upward in the circumference of through-hole 4A, and has ring support part 4C protruding and formed upward concentrically across a gap at the outer circumferential side from inner tube 4B.

In operation body 1, as shown in FIG. 7, the inner circumference of defining protrusion 1B protruding downwardly in a circular ring shape is rotatably engaged with the outer circumference of inner tube 4B of base 4. Further in operation body 1, the outer circumferential lower side portion of operation body 1 is supported on ring support part 4C of base 4. At this time, ring magnet 3 integrated beneath operation body 1 is positioned in a ring-shaped space formed between inner tube 4B and ring support part 4C of base 4. Clearance hole 4D is formed in a specified angle range at the bottom position of ring-shaped space formed between inner tube 4B and ring support part 4C of base 4 (see FIG. 8).

Fixed magnet 5 for generating an operation contact sensation is fixed in a ring-shaped bottom portion formed between inner tube 4B and ring support part 4C of base 4. This fixed magnet 5, as shown in FIG. 8, is fixed only in part in the bottom portion, and the top side of fixed magnet 5 and the bottom side of ring magnet 3 are closely disposed opposite to each other across a specified gap in the vertical direction.

On wiring board 10, at a position corresponding to clearance hole 4D of base 4, detection element 11 such as an MR element or a Hall element for detecting changes in the intensity of a magnetic field is disposed. Also on wiring board 10, press-down switch 13 is disposed at a position corresponding to through-hole 4A provided in the center of base 4.

Insulating sheet 12 is disposed so as to cover wiring board 10 including detection element 11 and press-down switch 13. Above insulating sheet 12, base 4 is mounted so as to be engaged rotatably with operation body 1. Insulating sheet 12 is pressed down tightly on wiring board 10 at the lower end of leg part 20A protruding and formed beneath fixing member 20 constituted by the casing of an electronic appliance or the like. Insulating sheet 12 is pressed down at the outer edge of base 4 by inner step 20B provided in leg part 20A, and base 4 is positioned.

At a further inside upward position of inner step 20B, upper wall 20C is formed to protrude in a horizontal direction, and the peripheral portion of operation body 1 is assembled so as to be positioned beneath upper wall 20C. As a result, upward slipping of operation body 1 is prevented. The top side of operation body 1 at a position inwardly of upper wall 20C is provided with small, radial protrusions 1C for assisting operation.

The structure of press-down switch 13 is described. Press-down switch 13 has movable contact 14 of circular dome shape mounted on an outside fixed contact (not shown) provided on wiring board 10 at its outer circumferential end. Movable contact 14 is positioned and fixed on wiring board 10 by adhesive tape 17 disposed so as to cover the movable contact 14 from above. While press-down switch 13 is not operated, the central bottom side of movable contact 14 is disposed opposite across a specific gap a central fixed contact (not shown) disposed in wiring board 10. Adhesive tape 17 is covered with insulating sheet 12 as described above, and operation button 18 is mounted thereon for pressing movable contact 14 and is disposed movably in a vertical direction in through-hole 4A of base 4.

Operation button 18 has flange 18A protruding toward the outer circumferential side. While press-down switch 13 is not operated, the top side of flange 18A abuts against the bottom side of the inner edge composing circular central hole 1A of operation body 1, and upward slipping is prevented. The upper end of operation button 18 protrudes upward from circular central hole 1A.

The conventional rotary operation type input device is thus constituted, and its operation is as follows. The top side of operation body 1 of circular ring shape is touched by a finger or the like, and is rotated in a forward or reverse direction on a horizontal plane. By this rotating operation, operation body 1 rotates horizontally along the outer circumference of inner tube 4B of base 4 while being supported on ring support part 4C, and hence ring magnet 3 integrated with operation body 1 is rotated together with operation body 1.

Along with rotary movement of ring magnet 3, the distribution state of magnetic field fluctuates, and it is detected by detection element 11, and a specified output is obtained. By the output from detection element 11, the rotating direction and rotating amount of operation body 1 are judged. At the same time, one fixed magnet 5 for generating an operation contact sensation fixed to base 4 repeats attraction and repulsion with ring magnet 3, and this attraction and repulsion force is felt like a click contact sensation.

When operation button 18 disposed in the center of operation body 1 is pressed, the central position of movable contact 14 is pressed by the bottom convex part of operation button 18 by way of insulating sheet 12 and adhesive tape 17. When this pressing force exceeds a specified force, movable contact 14 is elastically inverted in the convex dome-like portion and the bottom side of the central part contacts with the central fixed contact, and hence the outside fixed contact and the central fixed contact electrically contact with each other, thereby turning on the switch.

When the pressing force of operation button 18 is removed, by the self-restoring force of movable contact 14, the dome-like portion returns to the original upward swollen state, and movable contact 14 is departed from the central fixed contact, thereby returning to the state shown in FIG. 7.

In the conventional rotary operation type input device, however, ring magnet 3 and fixed magnet 5 are disposed opposite to each other as mentioned above. Hence, the position to be mounted on insulating sheet 12, that is, the mechanical portion of operation body 1 combined with base 4 requires at least a specified clearance between ring magnet 3 and fixed magnet 5, and thus at least a specified vertical dimension to be laminated in the vertical direction. In such configuration, it is hard to meet the requirement of thin design of the entire device, and it is expensive because a plurality of magnets should be required.

In the conventional rotary operation type input device, moreover, ring magnet 3 is attracted and repelled to and from fixed magnet 5 in order to generate a click contact sensation. Although a clear click contact sensation is achieved by the attraction and repulsion force, operation body 1 moves up and down between ring support part 4C of base 4 and upper wall 20C of fixing member 20. Therefore, collision of operation body 1 against ring support part 4C or upper wall 20C is repeated, and an unusual sound is generated by such collision.

SUMMARY OF THE INVENTION

The present invention is intended to solve the problems of the prior art, and it is hence an object thereof to present a rotary operation type input device reduced in thickness of the mechanical portion and lowered in cost.

The present invention includes an operation body of circular ring shape, a first guide plate of a magnetic body fixed to the bottom side of the operation body, a plurality of movable magnets disposed on the bottom side of a first flat plane of the first guide plate concentrically with the operation body, a base for rotatably supporting the operation body from beneath, a detection element for detecting a change in magnetic field from the movable contacts due to rotating operation of the operation body without making contact, and a second guide plate of a magnetic body fixed to the base having a plurality of second flat planes opposite to the disposing position of the movable magnets so as to be opposite to each one of the movable magnets, in which the plurality of movable magnets face to or depart from each one of the second flat planes of the second guide plate depending on the rotation of the operation body.

According to this configuration, instead of using the fixed side magnet as in the prior art, a second guide plate of magnetic body plate material is used, and the mechanical component composed of base, operation body, and movable magnet can be easily reduced in thickness. Therefore, an inexpensive rotation operation type input device is presented. Besides, depending on the rotation of the operation body, the plurality of movable magnets face to and depart from each one of the second flat planes of the second guide plate. Accordingly, the difference between the attraction state and the release state is large, which may be surely felt as a click contact sensation. Further, the operation body is uniformly attracted or released on the entire circumference, and the operation body is free from unexpected vertical motion in rotating operation of the operation body, and generation of unusual sound is suppressed.

In the present invention, a downward bend is formed in the first flat plane of the first guide plate, and an upward bend is formed in the second flat plane of the second guide plate, so as to be opposite to each other closely to the downward bend, and when the movable magnet is opposite to the second flat plane, the downward bend and the upward bend are opposite to each other, and a magnetic flux from the movable magnets is guided in a closed loop state and is set in attraction state by way of the first flat plane and downward bend of the first guide plate, and the second flat plane and upward bend of the second guide plate.

As a result, the magnetic flux from the movable magnets forms a closed loop by way of the downward bend and the upward bend. Therefore, an attraction state of a greater attraction force is created, and the difference from the release state not in the attraction state is much greater, and a clear click contact sensation is felt.

The present invention has a peripheral flange on the outer circumference of the operation body, and the peripheral flange is defined in the motion in the vertical direction by the fixing member.

Hence, the operation body is defined in the motion in the vertical direction by the fixing member, and a stable operation is realized.

In the present invention, the detection element is disposed near the base. Hence, the detection element is not particularly specified in the place of installation, and the mechanical component may be easily reduced in thickness.

In the present invention, the detection element is disposed beneath or at a side of the base, and the detection element can more easily detect a change in magnetic flux from the movable magnets.

DETAILED DESCRIPTION OF THE INVENTION

A rotary operation type input device in a preferred embodiment of the present invention is described specifically below while referring to the accompanying drawings. Same components as explained in the prior art are identified with the same reference numerals and repeated explanations are omitted.

Figure 1:
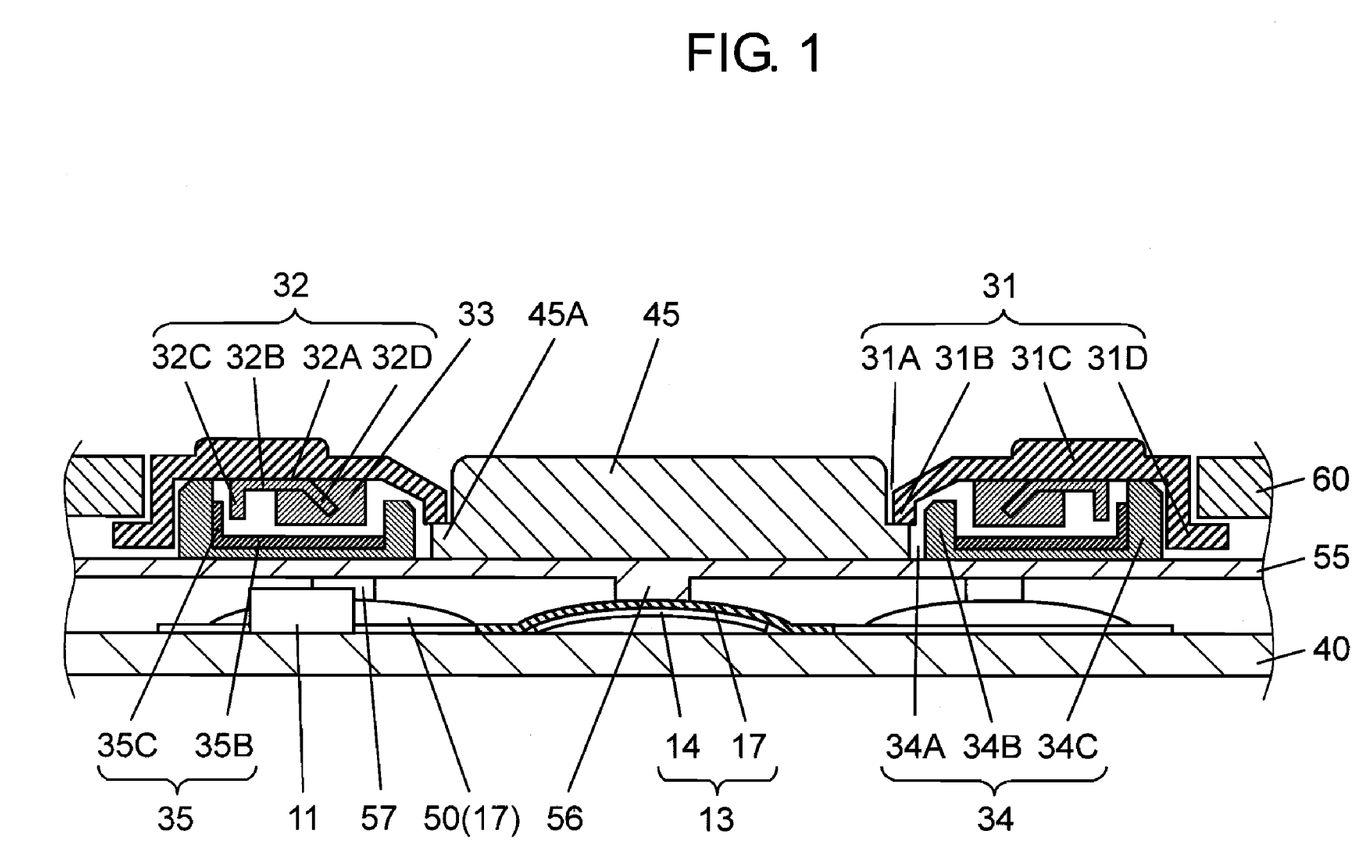
FIG. 1 is a sectional view of a rotary operation type input device in a preferred embodiment of the present invention.
Figure 2:
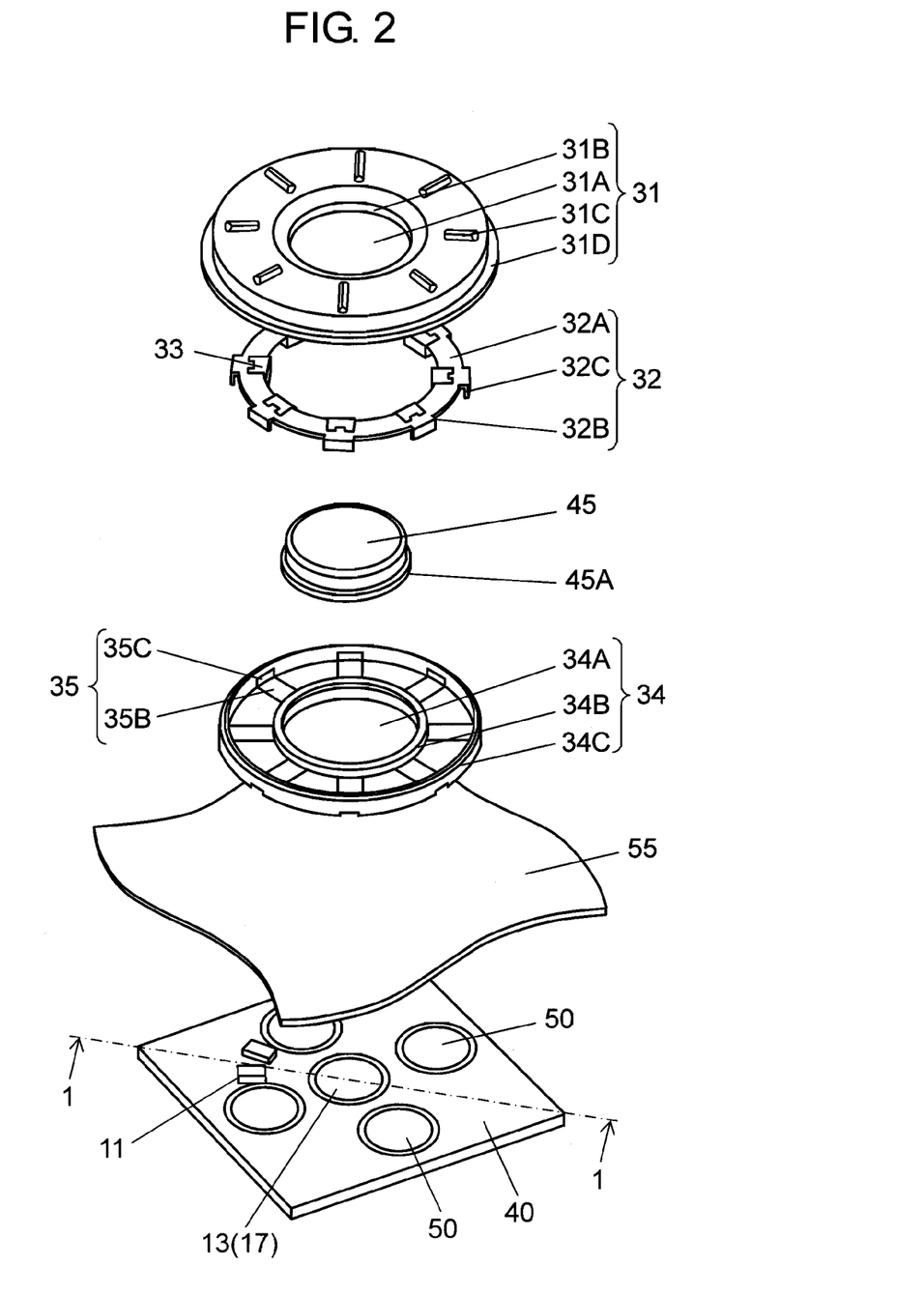
FIG. 2 is its perspective exploded view.
Figure 3:
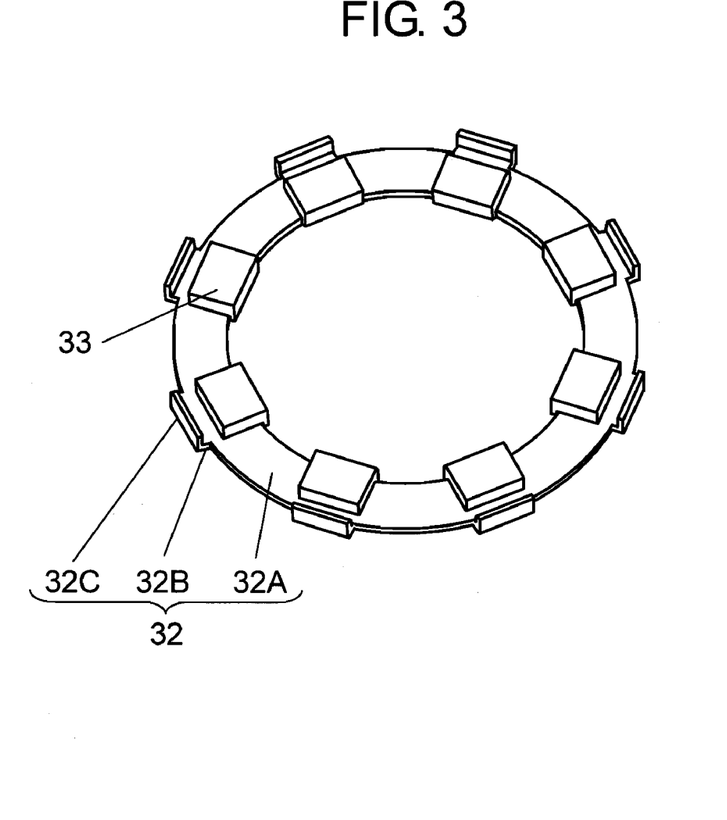
FIG. 3 is a perspective view of a first guide plate, an essential part of the preferred embodiment, as seen from below the first guide plate.
Figure 4:
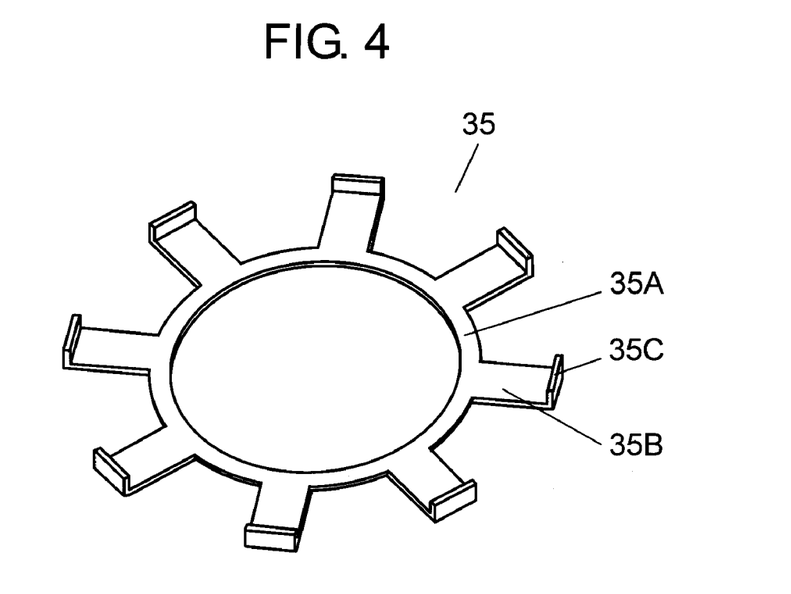
FIG. 4 is a perspective view of a second guide plate, an essential part of the preferred embodiment, as seen above the second guide plate single plate.

FIG. 1 is a sectional view of a rotary operation type input device in a preferred embodiment of the present invention, being a sectional view along line 1-1 in FIG. 2. FIG. 2 is a perspective exploded view of the rotary operation type input device in the preferred embodiment. FIG. 3 is a perspective view of a first guide plateas seen from below. FIG. 4 is a perspective view of a second guide plateas seen from above.

In FIG. 1 and FIG. 2, the rotary operation type input device of the preferred embodiment has operation body 31 made of resin formed in a disk of a circular ring shape having circular central hole 31A. Beneath operation body 31 is provided first guide plate 32 of circular ring shape made of magnetic plate material such as silicon steel plate or magnetic stainless steel plate, being overlaid in central position and fixed.

This first guide plate 32 has box-like movable magnets 33 externally inserted so that the main body may be positioned at the downside formed in a flat plane of first flat plane 32A. A total of eight movable magnets 33 are disposed at equal angular pitches on the concentric circumferential positions of first guide plate 32, that is, on operation body 31 The movable magnets 33 are independent of one another and in the same shape, and are fixed to first flat plane 32A, and their bottom sides are magnetized in the same polarity of either N pole or S pole. Each movable magnet 33 is disposed, in same peripheral direction, across a specified gap the same as the width dimension in the circumferential direction side of one movable magnet 33, and the bottom side of first flat plane 32A is exposed to the mutually opposite position of movable magnets 33.

Movable magnets 33 are externally inserted individually into first guide plate 32 as mentioned above, but may be also formed in a linked and integrated ring shape by connecting the individual magnets by resin or the like, and may be fixed at the bottom side of first guide plate 32. They may be also formed in a C-ring as seen from the top by opening in part.

First flat plane 32A of first guide plate 32 is formed in a ring having a width broader than the radial dimension of movable magnets 33. At the outer peripheral end position in the radial direction at the outer circumferential side of each movable magnet 33 of first flat plane 32A, eight protrusions 32B are formed, protruding to the outer side toward the radial direction nearly in the same dimension as the width dimension of the circumferential direction side of movable magnets 33. The leading end of each of protrusions 32B is bent downward in an L-shape, and formed in downward bend 32C.

The top sides of movable magnets 33, and the top sides of first flat plane 32A and protrusions 32B of first guide plate 32 are set nearly at the same height position, and all top side portions are fixed to the bottom side of operation body 31. To stabilize the integrated state of first guide plate 32 and movable magnets 33, as shown in FIG. 1, for example, slope 32D is provided at the inner peripheral end of first guide plate 32. As a result, biting of movable magnet 33 into first guide plate 32 may be enhanced.

Beneath operation body 31, there is base 34 made of resin formed in a circular ring shape having through-hole 34A in the circular center. Inner tube 34B protruding upward is provided at inner peripheral end position forming through-hole 34a of base 34. Outer tube 34C similarly protruding upward is provided at an outer periphery of base 34.

Operation body 31 has defining protrusion 31B of circular ring shape protruding downward and formed at an inner peripheral position for composing circular central hole 31A. The inner circumference of defining protrusion 31B is rotatably engaged and combined with the wall at the side of penetration hole 34A of inner tube 34B of base 34. The bottom side of the outer circumference of operation body 31 is supported on outer tube 34C of base 34. Thus, operation body 31 is combined with base 34, and first guide plate 32 fixed to the bottom side of operation body 31 is disposed opposite to the bottom position formed in the circular ring shape between inner tube 34B and outer tube 34C of base 34. At the bottom position of the circular ring shape, second guide plate 35 of magnetic body plate material is inserted and fixed.

Second guide plate 35 includes, as shown in FIG. 4, central ring 35A, eight second planes 35B formed radially from central ring 35A, and upward bends 35C formed at the outer circumferential ends of second flat planes 35B. Second flat planes 35B are formed radially outward in the radial direction corresponding to the disposition angle of eight movable magnets 33 from central ring 35A. Second flat planes 35B have nearly the same dimension as the width dimension at inner circumferential side of movable magnets 33, and are formed in a flat rectangular shape. Upward bends 35C are each folded and formed upward in an L-shape from the outer circumferential end of second flat planes 35B. Central ring 35A, second flat planes 35B, and upward bends 35C are formed integrally by blanking one piece of magnetic body plate material such as silicon steel plate or magnetic stainless steel plate, and bending and processing.

Central ring 35A of second guide plate 35 is buried and fixed in inner tube 34B of base 34. The bottom side of each second flat plane 35B extending in a horizontal direction is fixed to the bottom position between inner tube 34B and outer tube 34C of base 34. Further, the outer side of upward bend 35C is fixed to the inner side of outer tube 34C. The top side of each second flat plane 35B is exposed upward at the bottom position between inner tube 34B and outer tube 34C. The inner side of each upward bend 35C, the upper end corner of inner circumferential side, and the upper end of the vicinity are also exposed.

Opposite to the top side of second flat plane 35B of second guide plate 35, the bottom side of movable magnets 33 integrated with operation body 31 faces across a specified clearance in the vertical direction, as shown in FIG. 1. Downward bends 32C of first guide plate 32 are positioned radially inside of the upward bends 35C of second guide plate 35. Downward bends 32C and upward bends 35C are disposed oppositely across a tiny gap between the outer side of downward bends 32C and the inner side of upward bends 35C. The location of gaps between downward bends 32C of first guide plate 32 and upward bends 35C of second guide plate 35 is not particularly specified, but may be disposed at the inner circumferential side by properly setting the shape of first guide plate 32 and second guide plate 35.

The mechanical structure for rotary operation is composed by these members from operation body 31 to base 34 as explained above. As described herein, the configuration of the preferred embodiment is composed of only eight single movable magnets 33. Further, instead of the conventional fixed magnet, second guide plate 35 is fixed to base 34. Hence, according to the configuration of the preferred embodiment, the number and quantity of magnets to be used are smaller than in the prior art, and the structure is inexpensive. Besides, since second guide plate 35 is used, the structure is easily reduced in thickness relative to the prior art according to the configuration of the preferred embodiment.

The mechanical structure for rotary operation is positioned on the board structure the same as in the prior art, and the board structure is explained below.

As shown in FIG. 2, the board structure includes wiring board 40, and two detection elements 11 mounted thereon, such as an MR element or a Hall element capable of detecting changes in the intensity of magnetic field. The board structure also includes press-down switch 13 of the same composition as in the prior art, and four press-down peripheral switches 50 disposed around press-down switch 13 at intervals of 90 degrees at circumferential positions. Rubber sheet 55 of elastic insulating rubber is disposed to cover the switches from above.

Press-down switch 13 is exactly the same in structure as in the prior art. Press-down bump 56 of small-diameter columnar shape is protruding and formed at the bottom side of rubber sheet 55 contacting on press-down switch 13. The lower end of press-down bump 56 abuts against adhesive tape 17 positioning and fixing movable contact 14, conforming to the central position of movable contact 14 formed in a dome shape from an elastic metal thin plate.

Peripheral switches 50 are also the same in structure as press-down switch 13, but are identified by different name and reference numeral as peripheral switches 50 in order to distinguish from press-down switch 13 at the central position. In these peripheral switches 50, similarly, press-down bumps 57 of small-diameter columnar shape are protruding and formed at the bottom side of rubber sheet 55 so as to operate correspondingly.

In this mechanical structure, movable magnets 33 and detection elements 11 are disposed in mutually opposite relation in the vertical direction by way of rubber sheet 55 and base 34. Press-down switch 13 is mounted on rubber sheet 55 so as to be disposed in a lower position in through-hole 34A provided in the center of base 34, and thereby a rotary operation type input device is constituted.

Operation button 45 is disposed in through-hole 34A in the center of base 34, and the lower end formed in its flat plane is mounted tightly on rubber sheet 55. Operation button 45 is movable vertically while the outer side of cylindrical flange 45A protruding from the lower end outer circumference is defined by the inner peripheral wall of inner tube 34B of base 34. Therefore, in the ordinary state, while operation button 45 is not manipulated, the top side of flange 45A abuts against the lower end of defining protrusion 31B formed downwardly and surrounding circular central hole 31A of operation body 31, and is thereby prevented from slipping upward. In this state, the upper end of operation button 45 is exposed upward from circular central hole 31A of operation body 31.

The mechanical structure having such configuration mounted and disposed on rubber sheet 55 in the bottom of base 34 is entirely inclined in a specific direction by a press-down operation from above operation body 31 depending on the position of each peripheral switch 50. Accordingly, rubber sheet 55 is deflected partly, and peripheral switches 50 can be manipulated individually depending on the corresponding position by corresponding press-down bump 57.

Operation body 31 of this mechanical structure is defined in position by the upper wall of fixing member 60 composed of box or the like in the electronic appliance. That is, above peripheral flange 31D of operation body 31, the upper wall of fixing member 60 protruding in the horizontal direction is assembled so as to be positioned across a specified gap. Thus, operation body 31 is prevented from slipping upward. Small protrusions 31C provided at the top side of operation body 31 at the inside position of the upper wall are protruding slightly from the top side of fixing member 60. Herein, positioning of the entire mechanical structure or fixing of rubber sheet 55 may be achieved by fixing member 60 same as in the prior art.

The rotary operation type input device of the preferred embodiment is thus composed, and operates as explained below.

The top side of operation body 31 having small protrusion 31C is turned by a finger or the like, and rotated in normal or reverse direction on the horizontal plane, and operation body 31 rotates horizontally while being defined by the inner peripheral wall of inner tube 34B and the upper end of outer tube 34C of base 34. As a result, first guide plate 32 fixed to operation body 31 and movable magnets 33 rotate simultaneously in unison. At the time of operation, since a finger can be hooked on small protrusion 31C of operation body 31 to turn operation body 31, and the finger does not slip and it is easy to operate, it can be turned continuously without leaving the finger.

When these eight movable magnets 33 move in the rotating direction, the intensity of magnetic field changes, and it is detected by two detection elements 11 mounted on wiring board 40, and specified outputs are obtained. By defining the configuration so that these outputs may be obtained at specified pulse outputs having a phase difference, the amount of rotation and the direction of rotation can be detected, and it functions as a so-called rotary type encoder.

In the configuration of the preferred embodiment, although a fixed magnet is not used, in this rotating operation, a same operation contact sensation as attraction and repulsion force by the mutual magnets in the prior art is obtained. The reason is explained below.

In the configuration of the preferred embodiment, second flat planes 35B of second guide plate 35 are set at a width nearly the same as the width dimension of the circumferential direction side of movable magnets 33, and are fixed at eight positions of equal angles corresponding to the positions of these eight movable magnets 33. Each top side of second flat planes 35B is exposed and fixed at base 34 so as to be opposite to each movable magnet 33 individually. In such configuration, each movable magnet 33 moves to be opposite to each second flat plane 35B at the same timing from the state opposite to the resin surface, and at the same time each downward bend 32C of first guide plate 35 approaches closer to each upward bend 35C of second flat planes 35 disposed on base 34. That is, when each movable magnet 33 is operated and rotated from the state opposite to the resin surface at the bottom of base 34, each movable magnet 33 confronts each second flat plane 35B, and simultaneously each downward bend 32C of first guide plate 32 approaches each upward bend 35C of second guide plate 35. Consequently, as indicated by an arrow in a magnified sectional view in FIG. 5, the magnetic flux from movable magnets 33 is guided into a route from second flat planes 35B of second guide plate 35 to upward bends 35C, downward bends 32C of first guide plate 32, protrusions 32B, first flat planes 32A, and back to movable magnets 33. That is, the magnetic flux from movable magnets 33 is guided in a closed loop around movable magnets 33, and the attraction force is intensified, and by the action of the strong attraction force, only a light effort is needed in rotation operation force. The angle position of the strongest attraction force is in the relation of the entire surface of the bottom sides of movable magnets 33 being opposite to second flat planes 35B of second guide plate 35. Further, the angle position of the strongest attraction force is in the relation of the outside surface of downward bends 32C of first guide plate 32 and the inside surface of upward bends 35C of second guide plate 35 being overlapped and closely opposite in the radial direction.

Figure 5:
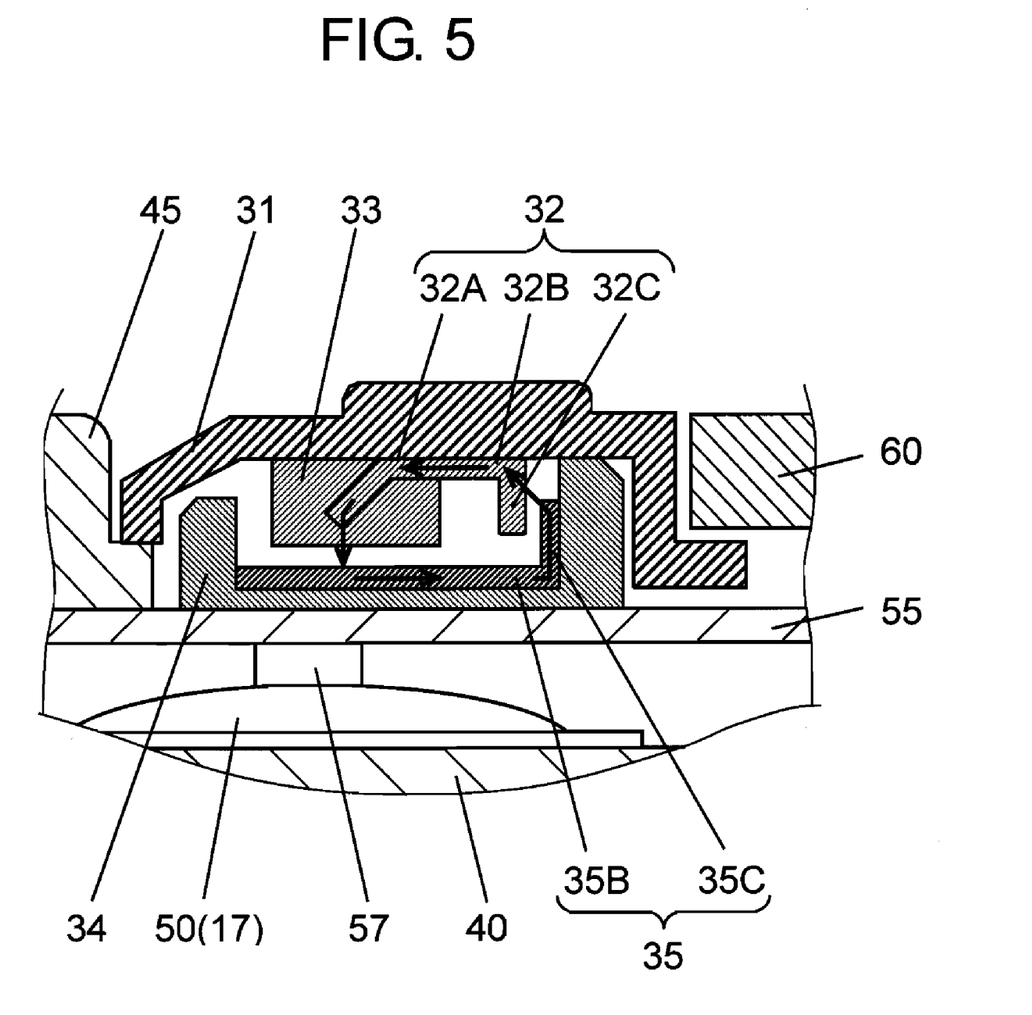
FIG. 5 is an essential magnified sectional view of guided state of magnetic flux from movable magnets in a closed loop state in the preferred embodiment.

In succession, when each movable magnet 33 opposite to each second flat plane 35B of second guide plate 35 is rotated, each movable magnet 33 is departed from the resin surface at the bottom of base 34. At this time, by the action of the attraction force, the rotation operation force becomes heavy, and when each movable magnet 33 is opposite to the resin surface, the attraction force is the smallest, and this is the release state.

In the configuration of the preferred embodiment, this motion is repeated, and the operation contact sensation when rotating is obtained. Since eight movable magnets 33 are disposed on the circumference at equal angle pitches, during one revolution of operation body 31, the rotation operation force is felt heavy at eight positions at intervals of 45 degrees depending on the locations of movable magnets 33. Further, since movable magnets 33 are provided at a pitch of 45 degrees of equal angle, the attraction state and release state are generated at the same timing, the difference in contact sensation between attraction and release states is eight times more than a single magnet. Besides, operation body 31 is uniformly attracted and released on the whole circumference without effect of repulsive force, and operation body 31 is not moved up or down unexpectedly during rotation of operation body 31, and generation of unusual sound is suppressed. In the configuration of the preferred embodiment in which movable magnets 33 are individually disposed at mutual intervals in the circumferential direction, the resin surface and second flat planes 35B are positioned alternately in the circumferential direction at the bottom of base 34 corresponding to this state of disposition, the angle positions for setting the released state can be easily determined.

Thus, according to the preferred embodiment, specified outputs depending on variations of intensity of magnetic force due to rotation and movement of movable magnets 33 are obtained from detection elements 11. The plurality of movable magnets 33 can be simultaneously transferred to attraction state or release state, and the attraction angle position, the magnetic flux from movable magnets 33 is guide in a closed loop of movable magnets 33, first guide plate 32, and second guide plate 35, and the attraction force is reinforced, and the rotation contact sensation is generated. Accordingly, without fixed magnet being provided at the base 34 side, second guide plate 35 of magnetic body plate material is fixed, and a clear click feel is obtained in a thin type design. The required magnets are movable magnets 33 only, and they are single individual magnets. Hence, the quantity of magnets at the movable side is smaller than the quantity required in the prior art, and a fixed magnet is not needed, and thus the material cost is saved, and the entire structure is inexpensive.

In non-operation state in which operation body 31 is not being rotated, operation body 31 is in a state of maximum attraction force, that is, the entire surface of the bottoms sides of movable magnets 33 is opposite to second flat planes 35B of second guide plate 35. Also in the non-operation state, the outside surface of downward bends 32C of first guide plate 32 and the inside surface of upward bends 35C of second guide plate 35 are in mutually opposite states in the radial direction. At such angle position, operation body 31 is securely maintained in a stopped state, and is not rotated unexpectedly.

The rotation contact sensation may be freely adjusted by varying the intensity of attraction force by changing the conditions, such as the material of movable magnets 33, magnetization condition, facing distance of movable magnets 33 to second flat planes 35B of second guide plate 35, gap distance between downward bends 32C of first guide plate 32 and upward bends 35C of second guide plate 35, materials of both members, or their shapes. To increase the attraction force, it is important to compose a closed loop for guiding the magnetic flux from movable magnets 33 by forming, for example, downward bends 32C of first guide plate 32 and upward bends 35C of second guide plate 35 as described above. However, if sufficient attraction force is obtained such bends are not always necessary.

In the preferred embodiment, N poles and S poles of movable magnets 33 are provided at upper and lower positions. Instead, for example, N poles and S poles may be disposed along the radial direction of operation body 31, or setting positions of downward bends 32C of first guide plate 32 and upward bends 35C of second guide plate 35 may not be always specified to the set positions at the outer circumferential side. Detection elements 11 for detecting changes of magnetic field from movable magnets 33 may not be limited to the downward positions of the mechanical structure, but may be provided at positions inside of the mechanical structure, or outward positions parallel and spaced at specific intervals.

Figure 6:
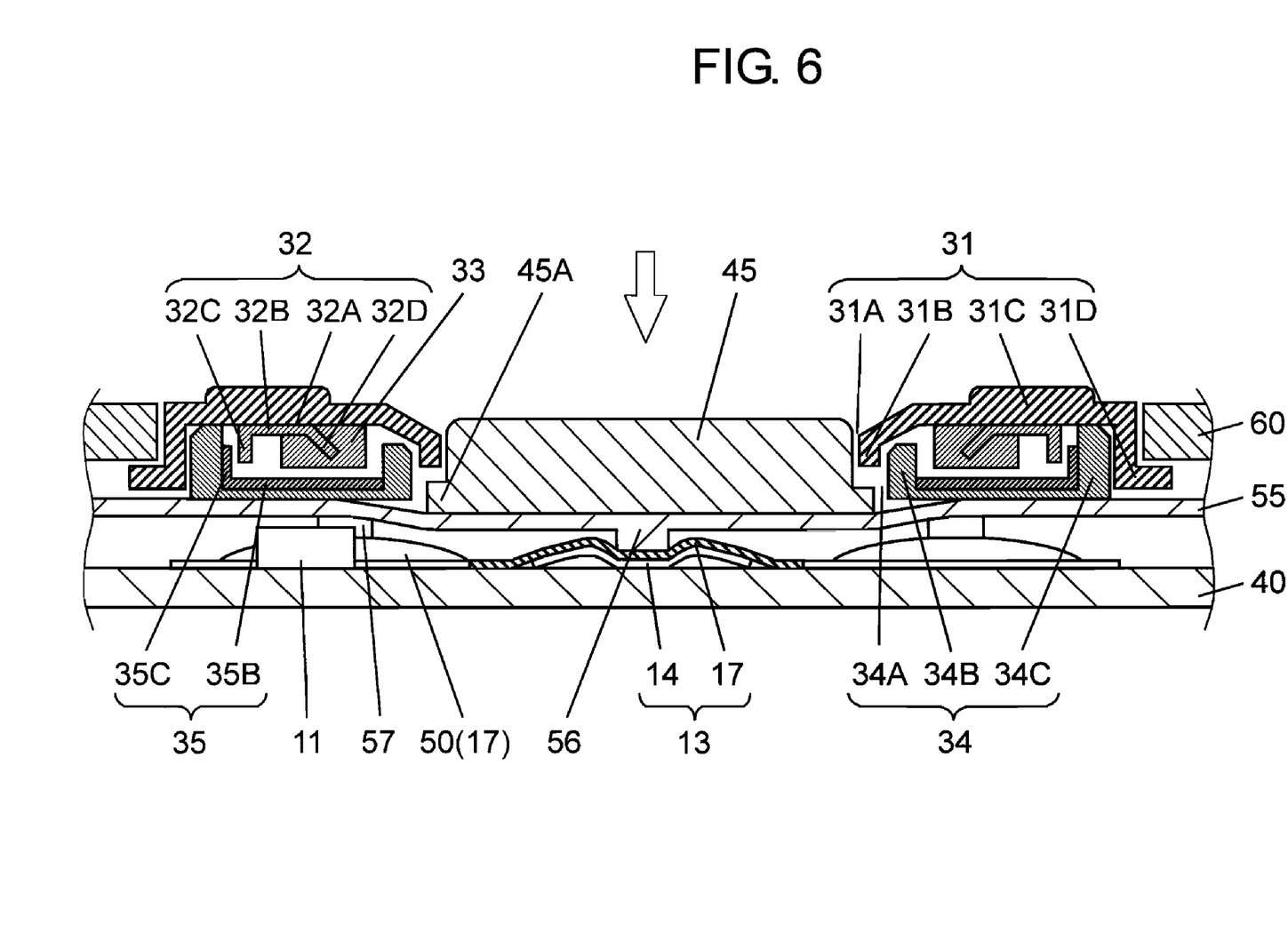
FIG. 6 is a sectional view explaining an operation state of a press-down switch disposed in a central position of an operation body in the preferred embodiment.

The motion at the time of pushing press-down switch 13 is briefly described below.

When the upper end of operation button 45 exposed from circular central hole 31A of operation body 31 is pressed down by a finger or the like, operation button 45 moves downward while the outside surface of flange 45A is defined in motion by the inner wall of inner tube 34B of base 34. As a result, the corresponding position of rubber sheet 55 is partially deflected downward, and the central position of movable contact 14 is pressed by press-down bump 56 by way of adhesive tape 17. When the pressing force exceeds a specified value, as shown in FIG. 6, the central position of movable contact 14 clicks and inverts, and the switch is turned on. When the pressing force on operation button 45 is removed, movable contact 14 clicks and returns to the original shape by its own elastic restoring force. The returning force of movable contact 14 is combined with the returning force of rubber sheet 55, and operation button 45 is pushed up to the original position, and the switch is turned off as shown in FIG. 1.

On the other hand, peripheral switches 50 are operated by pressing the position of operation body 31 corresponding to peripheral switches 50, and the entire mechanical structure is tilted in specified direction. Accordingly, by press-down bump 57 corresponding to rubber sheet 55, peripheral switches 50 disposed at corresponding positions are individually moved. When the pressing force is removed, the returning force of peripheral switches 50 is combined with the returning force of rubber sheet 55, and the state is restored as shown in FIG. 1.

Thus, according to the rotary operation type input device of the preferred embodiment, the rotation operation state of operation body 31 can be detected without making contact, and while not operated, operation body 31 is maintained securely at a stopped state, and such operation is realized in a thin type design. Further, the plurality of movable magnets 33 can be simultaneously moved closer to and remoter from opposite second flat planes 35B. When coming closer, the magnetic flux from movable magnets 33 is guided in a closed loop by means of first guide plate 32 and second guide plate 35 formed in a specified shape. Hence, without using a magnet at the fixed side, the operation force in rotation can be freely increased and decreased. Therefore, in the preferred embodiment, a clear click feel is obtained, and a favorable rotation operation contact sensation that has less deterioration of contact sensation is maintained and realized for a long period and at a low cost. It is hence useful for composing an input operation part for searching and entering various electronic data in various electronic appliances.

For example, when the rotary operation type input device is used in a portable telephone, the top side surface of operation body 31 exposed from the case is rotated, and a first signal is obtained from detection element 11. By this first signal, a desired telephone number can be selected from a list, such as telephone directory shown in the display unit of the portable telephone. Further, by pushing press-down switch 13, a second signal is obtained from press-down switch 13. By this second signal, the selected telephone number is determined and established, or a call may be transmitted. A third signal is obtained from peripheral switch 50. By this third signal, the telephone directory is changed to another menu display, and the first signal and the second signal are simultaneously changed over to the signals assigned to the menu.

This method of use is only an example, and the first to third signals may be assigned to proper functions as required, and various functions may be put in operation.

In the rotary operation type input device of the preferred embodiment, in particular, its mechanical structure can be formed thinly, and the thickness is smaller than in the prior art if press-down switch 13 and peripheral switches 50 are included, and the projection area corresponding to the operation range is small and compact, and it contributes to a thin and small design of an appliance.

Press-down switch 13 and peripheral switches 50 are not limited to the specified structure, and single switches completed as electronic components may be used. For example, press-down switch 13 may be a two-step action type switch or cross-key switch. Only press-down switch 13 may be disposed, or only peripheral switch 50 may be disposed, or they both may be disposed.

Instead of composing press-down switch 13 and peripheral switches 50 by using adhesive tape 17, by using one large adhesive tape, corresponding five movable contacts 14 may be positioned and fixed on wiring board 40.

Thus, according to the present invention, without using a fixed side magnet, a thin type rotary operation type input device capable of obtaining a click feel in rotation operation may obtained at low cost.

What is claimed is:

1. A rotary operation type input device comprising an operation body of circular ring shape, a magnetic first guide plate fixed to a bottom side of the operation body, a plurality of movable magnets disposed on the a bottom side of a first flat plane of the first guide plate concentrically with the operation body, a base for rotatably supporting the operation body from beneath, a detection element for detecting a change in magnetic field from the movable magnets due to rotating operation of the operation body without making contact, and a magnetic second guide plate fixed to the base having a plurality of second flat planes opposite to the disposing position of the movable magnets so as to be opposite to each one of the movable magnets, wherein the plurality of movable magnets face to or depart from each one of the second flat planes of the second guide plate depending on the rotation of the operation body.

2. The rotary operation type input device of claim 1, wherein a downward bend is formed in the first flat plane of the first guide plate, and an upward bend is formed in each of the second flat planes of the second guide plate, so as to be opposite to each other closely to the downward bend, and when one of the movable magnets is opposite to one of the second flat planes, the downward bend and one of the upward bends are opposite to each other, and a magnetic flux from the movable magnets is guided in a closed loop state and is set in attraction state by way of the first flat plane and downward bend of the first guide plate, and said one of the second flat planes and said one of the upward bends of the second guide plate.

3. The rotary operation type input device of claim 1, further comprising a peripheral flange on the outer circumference of the operation body, wherein the peripheral flange is arranged so as to be engageable with a fixing member so as to limit vertical motion of the operation body.

4. The rotary operation type input device of claim 1, wherein the detection element is disposed near the base.

5. The rotary operation type input device of claim 1, wherein the detection element is disposed beneath or at a side of the base.

6. The rotary operation type input device of claim 1, wherein
   the first guide plate includes a downward bend that projects downwardly from the first flat plane toward the second guide plate;
   the second guide plate includes upward bends that respectively project upwardly from the second flat planes toward the first guide plate; and
   the downward bend and the upward bends are arranged so as to be positioned to face each other in a radial direction of the operation body across a radial gap.

7. The rotary operation type input device of claim 6, wherein
   the first guide plate further includes a downwardly sloped portion to enhance biting of the movable magnets into the first guide plate.

8. The rotary operation type input device of claim 7, wherein
   the operation body includes a radially outwardly projecting peripheral flange arranged to engage a fixing member from below to limit upward vertical movement of the operation body.

9. The rotary operation type input device of claim 6, wherein
   the operation body includes a radially outwardly projecting peripheral flange arranged to engage a fixing member from below to limit upward vertical movement of the operation body.

10. The rotary operation type input device of claim 1, wherein
    the operation body includes a radially outwardly projecting peripheral flange arranged to engage a fixing member from below to limit upward vertical movement of the operation body.

11. The rotary operation type input device of claim 1, wherein
    the first guide plate further includes a downwardly sloped portion to enhance biting of the movable magnets into the first guide plate.

* * * * *